US012733289B2

(12) United States Patent
Hsu et al.

(10) Patent No.: US 12,733,289 B2
(45) Date of Patent: Sep. 8, 2026

(54) OPTICAL SENSING APPARATUS

(71) Applicant: Artilux, Inc., Menlo Park, CA (US)

(72) Inventors: Huei-Hsiung Hsu, Hsinchu County (TW); Cheng-Te Yu, Hsinchu County (TW); Yu-Ting Chiu, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 494 days.

(21) Appl. No.: 18/345,830

(22) Filed: Jun. 30, 2023

(65) Prior Publication Data

US 2024/0063322 A1 Feb. 22, 2024

Related U.S. Application Data

(60) Provisional application No. 63/398,857, filed on Aug. 18, 2022.

(51) Int. Cl.

| | |
|---|---|
| ***H10F 55/00*** | (2025.01) |
| ***H10F 71/00*** | (2025.01) |
| ***H10F 77/122*** | (2025.01) |
| ***H10F 77/30*** | (2025.01) |
| ***H10F 77/50*** | (2025.01) |

(52) U.S. Cl.

CPC ......... *H10F 55/18* (2025.01); *H10F 71/1212* (2025.01); *H10F 77/122* (2025.01); *H10F 77/334* (2025.01); *H10F 77/50* (2025.01)

(58) Field of Classification Search

CPC ...... H10F 55/18; H10F 55/25; H10F 71/1212; H10F 71/00; H10F 77/122; H10F 77/334; H10F 77/50; H10K 71/00; H10K 59/60; H10K 59/873; H10K 65/00; H01L 25/167; H01S 5/02315; H01S 5/0262; H10H 20/01; H10H 20/85; H10H 20/8506

See application file for complete search history.

(56) References Cited

U.S. PATENT DOCUMENTS

2004/0095501 A1* 5/2004 Aizawa ................. H10F 39/804 257/E31.127
2010/0181578 A1* 7/2010 Li ......................... H10F 55/155 257/E31.095
2013/0001710 A1* 1/2013 Daneman ........... G02B 26/0833 257/415

(Continued)

*Primary Examiner* — Sitaramarao S Yechuri
(74) *Attorney, Agent, or Firm* — Dority & Manning, P.A.

(57) ABSTRACT

Systems, apparatuses, and methods for optical sensing are provided. For example, an optical sensing apparatus can include a substrate, a light-receiving device, a light-emitting device, an encapsulating structure, a covering cap, and an adhesive layer. The light-receiving device and the light-emitting device can be disposed on and electrically connected to the substrate. The encapsulating structure can be disposed on the substrate and cover the light-emitting device and the light-receiving device. The encapsulating structure can include a top surface, a first side surface, and a lower surface. The first side surface and the lower surface can collectively form a recess. The covering cap can be disposed on the encapsulating structure and can include a first opening, a top portion, a protruding portion, and an extending portion. The adhesive layer can be arranged between the encapsulating structure and the covering cap to adhere the encapsulating structure and the covering cap.

16 Claims, 8 Drawing Sheets

600

(56) References Cited

U.S. PATENT DOCUMENTS

2019/0123213 A1* 4/2019 Yu ........................ H10H 20/854
2022/0140172 A1* 5/2022 Tsou .................... H10H 20/857 257/82
2023/0317699 A1* 10/2023 Hofrichter .......... H01L 23/4985 257/80

* cited by examiner

OPTICAL SENSING APPARATUS

PRIORITY CLAIM

The present application claims benefit of U.S. Provisional Patent Application Ser. No. 63/398,857, having a filing date of Aug. 18, 2022, which is incorporated herein by reference in its entirety.

FIELD

The present disclosure relates generally to sensor systems. In particular, the present disclosure provides an optical sensing apparatus and related method.

BACKGROUND

Optical sensors are being used in many systems, such as smartphones, wearable electronics, robotics, and autonomous vehicles, etc. for proximity detection, 2D/3D imaging, object recognition, image enhancement, material recognition, color fusion, health monitoring, and other relevant applications. The present disclosure discloses an optical sensing apparatus having a covering cap covering the light-emitting device and the light-receiving device. The optical sensing apparatus can be operable for different wavelength ranges, including visible (e.g., wavelength range 380 nm to 780 nm, or a similar wavelength range as defined by a particular application) and non-visible light. The non-visible light includes near-infrared (NIR, e.g., wavelength range from 780 nm to 1400 nm, or a similar wavelength range as defined by a particular application) and short-wavelength infrared (SWIR, e.g., wavelength range from 1400 nm to 3000 nm, or a similar wavelength range as defined by a particular application) light.

SUMMARY

Aspects and advantages of embodiments of the present disclosure will be set forth in part in the following description, or can be learned from the description, or can be learned through practice of the embodiments.

One example aspect of the present disclosure relates to an optical sensing apparatus. The optical sensing apparatus may include a substrate, a light-receiving device disposed on and electrically connected to the substrate, a light-emitting device disposed on and electrically connected to the substrate, an encapsulating structure disposed on the substrate, a covering cap disposed on the encapsulating structure, and an adhesive layer arranged between the encapsulating structure and the covering cap to adhere the encapsulating structure and the covering cap. The encapsulating structure may cover the light-emitting device and the light-receiving device. The encapsulating structure may include a top surface, a first side surface, and a lower surface. The first side surface and the lower surface may collectively form a recess. The covering cap may include a first opening, a top portion, a protruding portion, and an extending portion. Furthermore, the protruding portion may extend from the top portion towards the substrate and contacts to the top surface of the encapsulating structure. The extending portion may extend from the top portion towards the substrate and is arranged in the recess. The covering cap may not extend beyond the encapsulating structure in a top view.

In some implementations, the covering cap includes a material configured to shield or absorb a NIR light or a SWIR light.

In some implementations, the encapsulating structure may include a material transparent to a NIR light or a SWIR light.

In some implementations, the light-receiving device may include a photoelectronic device having a detecting region comprising germanium.

In some implementations, the first opening may have a first position corresponding to the light-receiving device in a cross-sectional view.

In some implementations, the extending portion may be located at a periphery of the encapsulating structure.

In some implementations, the extending portion may have an outer side surface coplanar to that of the encapsulating structure.

In some implementations, the protruding portion may surround the first opening.

In some implementations, the protruding portion may surround at least a portion of the first opening.

In some implementations, the covering cap may include a second opening having a second position corresponding to the light-transmitting device. Furthermore, the protruding portion may surround at least a portion of the second opening. In some implementations, the second opening may have an area smaller than that of the first opening.

In some implementations, the adhesive layer may have a first portion located between the top portion and the top surface, and a second portion located in the recess; the first portion may have a thickness thicker than that of the second portion.

In some implementations, the light-receiving device may have an area larger than the light-emitting device.

Another example aspect of the present disclosure is directed to a method for manufacturing an optical sensing apparatus. The method includes forming a covering cap having a first opening, a top portion, a protruding portion, and an extending portion. The method further includes providing a substrate. The method further includes disposing a light-receiving device and a light-emitting device on the substrate. The method further includes forming an encapsulating structure on the substrate to cover the light-emitting device and the light-receiving device. The method further includes forming a recess on the encapsulating structure for accommodating the extending portion. The method further includes forming a glue on the encapsulating structure. The method further includes aligning the covering cap to the light-receiving device and the light-emitting device so that the first opening is located above the light-receiving device. The method further includes adhering the covering cap on the encapsulating structure through the glue. The method further includes dicing to form the optical sensing apparatus.

Another example aspect of the present disclosure is directed to an optical sensing apparatus. The optical sensing apparatus includes a substrate, a light-receiving device disposed on and electrically connected to the substrate, a light-emitting device disposed on and electrically connected to the substrate, an encapsulating structure disposed on the substrate and covering the light-emitting device and the light-receiving device, a covering cap disposed on the encapsulating structure, and an adhesive layer arranged between the encapsulating structure and the covering cap to adhere the encapsulating structure and the covering cap. The encapsulating structure includes a recess. The covering cap includes a first opening, a top portion, and a first extending portion. Furthermore, the first extending portion extends from the top portion towards the substrate and is arranged in the recess. The covering cap does not extend beyond the encapsulating structure in a top view.

In some implementations, the optical sensing apparatus further includes a second extending portion extending from the top portion. The second extending portion is located between the light-receiving device and the light-emitting device.

In some implementations, the adhesive layer has an outmost side shrunk from that of the covering cap. Furthermore, the outmost side of the adhesive layer has a curved shape.

In some implementations, the light-receiving device includes a photoelectronic device having a detecting region comprising germanium.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

Figure 1:
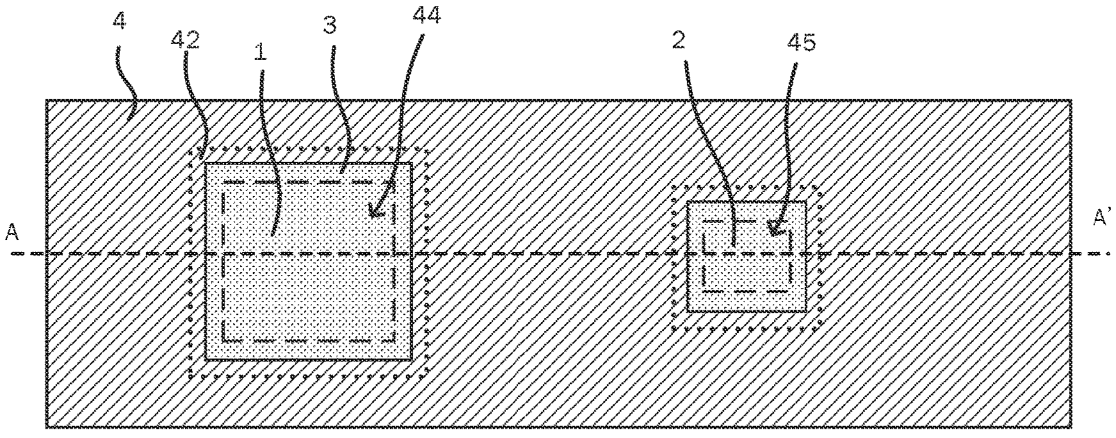
FIG. 1 shows a top view of an optical sensing apparatus in accordance with one embodiment of the present disclosure.

Repeat use of reference characters in the present specification and drawings is intended to represent the same and/or analogous features or elements of the present invention.

DETAILED DESCRIPTION

The following embodiments accompany the drawings to illustrate the concept of the present disclosure. In the drawings or descriptions, similar or identical parts use the same reference numerals, and in the drawings, the shape, thickness or height of the element is can be reasonably expanded or reduced. The embodiments listed in the present application are only used to illustrate the present application and are not used to limit the scope of the present application. Any obvious modification or change made to the present application does not depart from the spirit and scope of the present application.

Figure 2:
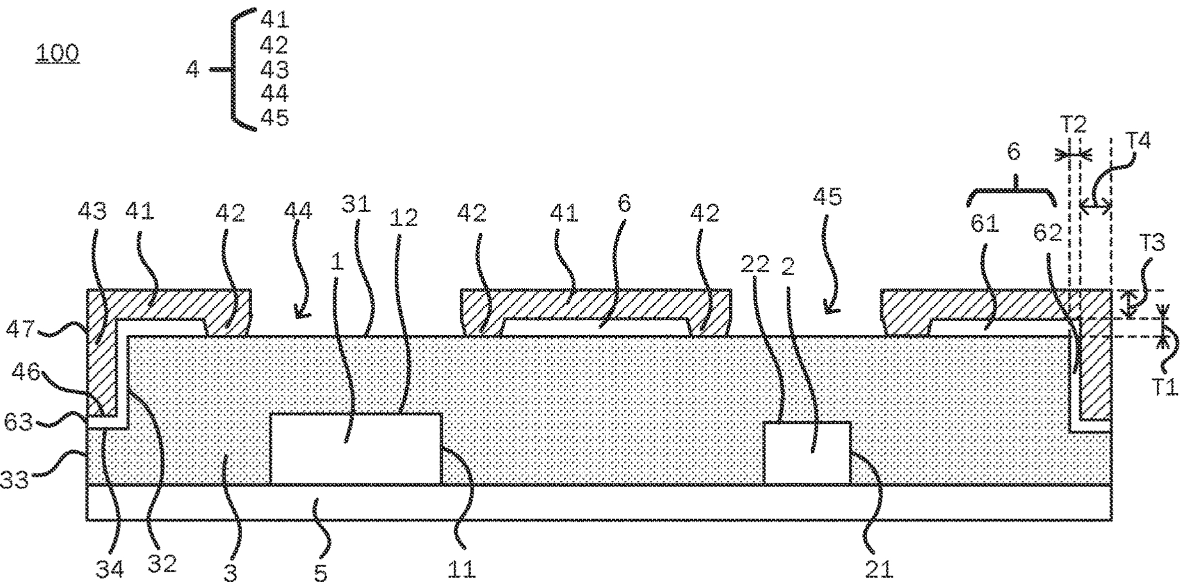
FIG. 2 shows a cross-sectional view of an optical sensing apparatus in accordance with one embodiment of the present disclosure.

FIG. 1 illustrates a top view of an optical sensing apparatus 100 in accordance with an embodiment of the present disclosure. FIG. 2 illustrates a cross-sectional view taken along the line AA' in FIG. 1. The optical sensing apparatus 100 includes a substrate 5, a light-receiving device 1, a light-emitting device 2, an encapsulating structure 3, an adhesive layer 6, and a covering cap 4. The light-receiving device 1 is disposed on and electrically connected to the substrate 5. The light-emitting device 2 is disposed on and electrically connected to the substrate 5. In some embodiments, an area of the light-receiving device 1 is larger than that of the light-emitting device in the top view (e.g., normal to the incident light). The light-receiving device 1 includes a side surface 11 and a top surface 12. The light-emitting device 2 includes a side surface 21 and a top surface 22. An encapsulating structure 3 is disposed on the substrate 5 to cover the light-receiving device 1 and the light-emitting device 2. The encapsulating structure 3 contacts the side surfaces 11, 21 and the top surfaces 12, 22. The encapsulating structure 3 includes a top surface 31 distant from the top surfaces 12, 22.

The covering cap 4 is disposed on the encapsulating structure 3 to shield or absorb the interfering light (e.g., ambient light, reflected light from undesirable angles and places, etc.). Accordingly, the covering cap 4 is configured to prevent the interfering light entering into the light-receiving device 1. Furthermore, the covering cap 4 is also configured to shield (e.g., protect) the light-receiving device 1 and the light-emitting device 2. The interfering light can be visible light or non-visible light from the ambience. The non-visible light includes NIR light and\or SWIR light. The covering cap 4 includes a first opening 44 and a second opening 45. The first opening 44 has a position corresponding to the light-receiving device 1. The second opening 45 has a position corresponding to the light-emitting device 2. In an embodiment, the second opening 45 may have an area smaller than that of the first opening 44. In details, in the top view, the area of the first opening 44 is similar to or larger than that of the light-receiving device 1. The area of the second opening 45 is similar to or larger than that of the light-emitting device 2. In an embodiment, the ratio of the area of the first opening 44 to that of the light-receiving device 1 can be in the range of 1~2.5. The ratio of the area of the second opening 45 to that of the light-emitting device 2 can be in the range of 1~2.5. Therefore, the light emitted from the light-emitting device 2 is emitted towards the target object, such as skin, food, blood vessel, etc., and reflected by the target object as a reflected light. The reflected light is directed towards the light-receiving device 1, so the optical sensing apparatus 100 or another computing device (not shown) can calculate the sensing result according to the measurement of the light-receiving device 1.

The covering cap 4 is adhered to the encapsulating structure 3 through the adhesive layer 6. In some implementations, the covering cap 4 does not extend beyond the encapsulating structure 3 in the top view. As shown in FIG. 2, the covering cap 4 includes a top portion 41, a plurality of protruding portions 42, and an extending portion 43. The plurality of protruding portions 42 extend from the top portion 41 towards the substrate 5, and contacts to the top surface 31 of the encapsulating structure 3. Hence, the covering cap 4 is distant from the encapsulating structure 3 by a distance greater than zero. Consequently, the adhesive layer 6 is located in a space between the covering cap 4 and the encapsulating structure 3. The plurality of protruding portions 42 are located near the first opening 44 and the second opening 45, so as to prevent the adhesive layer 6 from overflowing into the first opening 44 and the second opening 45 to affect the light paths of the light-receiving device 1 and the light-transmitting device 2. In one embodiment, the plurality of protruding portions 42 are located at two opposite sides of the first opening 44, and at two opposite sides of the second opening 45 in a cross-sectional view. In another embodiment, the plurality of protruding portions 42 encloses the first opening 44 and the second opening 45 in the top view. In an embodiment, the adhesive layer 6 is fully filled in the space between the covering cap 4 and the encapsulating structure 3. In another embodiment, the adhesive layer 6 is partially filled in the space between the covering cap 4 and the encapsulating structure 3. FIG. 2 shows that the protruding portion 42 has a trapezoidal shape which is not a limitation of the present disclosure. In other embodiments, the protruding portion 42 can be other shapes, such as rectangle, triangle, rhombus, parallelogram, square, circular, or other polygons.

In some implementations, the extending portion 43 extends from the top portion 41 towards the substrate 5 and has a lower end 46 distant from the substrate 5 by a distance in the range of 50~200 μm. The encapsulating structure 3 has a plurality of recesses each having a shape substantially matched with the corresponding extending portion 43 so as to accommodate the corresponding extending portion 43. In details, the encapsulating structure 3 has a first side surface 32, an outer side surface 33, and a lower surface 34. The first side surface 32 is on a different plane from the outer side surface 33 (e.g., through etching, precision cutting, etc.), the lower surface 34 connects to the first side surface 32 and the outer side surface 33. The lower surface 34 and the first side surface 32 collectively form the recess in the cross-sectional view. The extending portion 43 is located in the recess and adhered to the encapsulating structure 3 through the adhesive layer 6. In details, the adhesive layer 6 has a first portion 61 and a second portion 62. The first portion 61 is disposed on the top surface 31 of the encapsulating structure 3 for bonding the top portion 41 of the covering cap 4 to the encapsulating structure 3. The second portion 62 is disposed in the recess of the encapsulating structure 3, between the first side surface 32 and the extending portion 43, and between the lower surface 34 and the extending portion 43 for bonding the extending portion 43 to the encapsulating structure 3. The covering cap 4 has an outer side surface 47 coplanar to the outer side surface 33 of the encapsulating structure 3. The second portion 62 of the adhesive layer 6 has an outer side surface 63 coplanar to the side surfaces 33, 47. The extending portion 43 is located at a periphery of the encapsulating structure 3 for enhancing the mechanical reliability of the optical sensing apparatus 100.

The first portion 61 of the adhesive layer 6 has a thickness T1 which is measured from the top surface 31 of the encapsulating structure 3 to a contacting surface of the top portion 41 of the covering cap 4. The second portion 62 of the adhesive layer 6 has a thickness T2 which is measured from the first side surface 32 or the lower surface 34 of the encapsulating structure 3 to a contacting surface of the extending portion 43 of the covering cap 4. In one embodiment, the thickness T2 is thinner than the thickness T1. Put differently, in one embodiment, the thickness T1 is thicker than the thickness T2. In another embodiment, the thickness T2 is substantially same as or larger than the thickness T1. As an example, the thickness T1 is in the range of 5~30 μm. The thickness T2 is in the range 2~30 μm. The top portion 41 of the covering cap 4 has a thickness T3 in the range of 100~350 μm. The extending portion 43 of the covering cap 4 has a thickness T4 in the range of 100~350 μm. In one embodiment, the thickness T3 is substantially same as the thickness T4. In another embodiment, the thickness T3 is different from the thickness T4. The thickness of the encapsulating structure 3 is measured from the substrate 5 to the top surface 31 of the encapsulating structure 3 and in the range of 150 μm~900 μm.

The light-receiving device 1 can include a single photoelectronic device or a plurality of photoelectronic devices arranged in an array. The photoelectronic device can be connected to the substrate 5 by flip bonding or wire bonding. In an embodiment, the light-receiving device 1 includes a plurality of photoelectronic devices arranged in a one-dimensional array or a two-dimensional array. In another embodiment, the light-receiving device 1 can include an electronic component electrically connected to the photoelectronic device for transmitting signal or providing power. The electronic component can include resistor, capacitor, inductor, or integrated circuit (IC). The photoelectronic device can include a supporting substrate and a detecting region supported by the supporting substrate. The detecting region can include germanium (Ge) and is configured to absorb photons. The supporting substrate can include a material, such as silicon, different from that of the detecting region. The light-receiving device 1 can detect the visible light, or non-visible light according to the application. The visible light can include blue, navy, green, yellow, or red light. The non-visible light can include NIR or SWIR.

The light-emitting device 2 can be a semiconductor light-emitting element, such as a light-emitting diode (LED), a laser diode, or organic light-emitting diode (OLED). The light-emitting device 2 can emit a light corresponding to the detecting wavelength of the light-receiving device.

The encapsulating structure 3 can be a silicone-based resin or epoxy-based resin and transparent to the light transmitted from the light-emitting device 2 or the light detected by the light-receiving device 1. The covering cap 4 can be a silicone-based resin, epoxy-based resin and contain a light-absorbing substance that blocks the unwanted light.

Figure 3A:
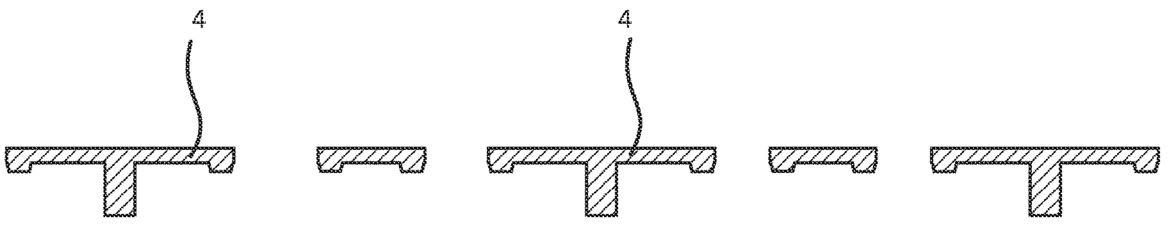
FIGS. 3A-3G show steps of manufacturing an optical sensing apparatus in accordance with one embodiment of the present disclosure.
Figure 3B:
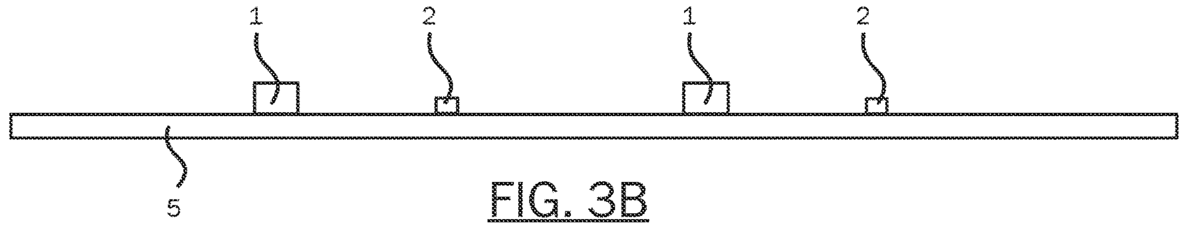
Figure 3C:
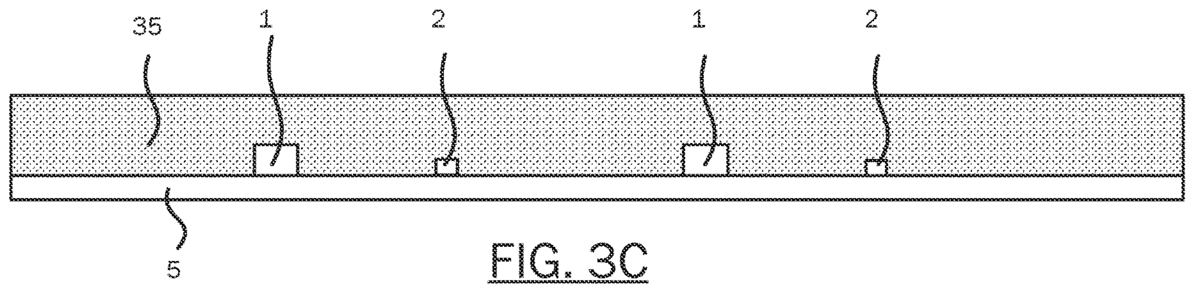
Figure 3D:
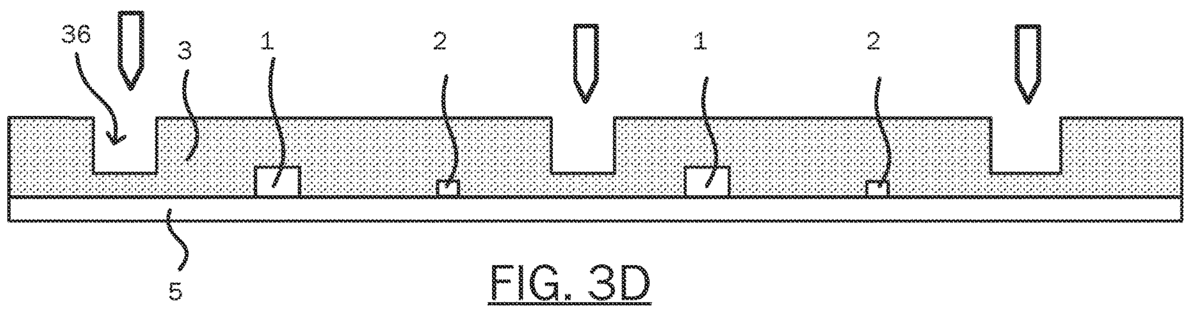
Figure 3E:
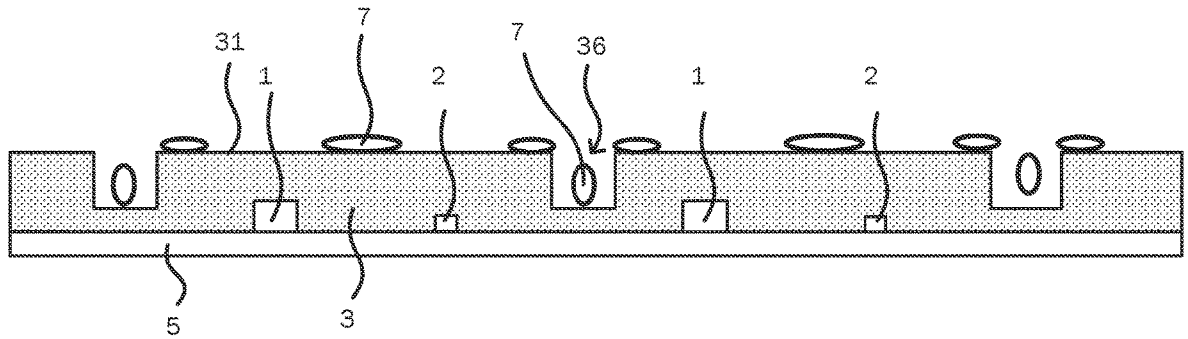
Figure 3F:
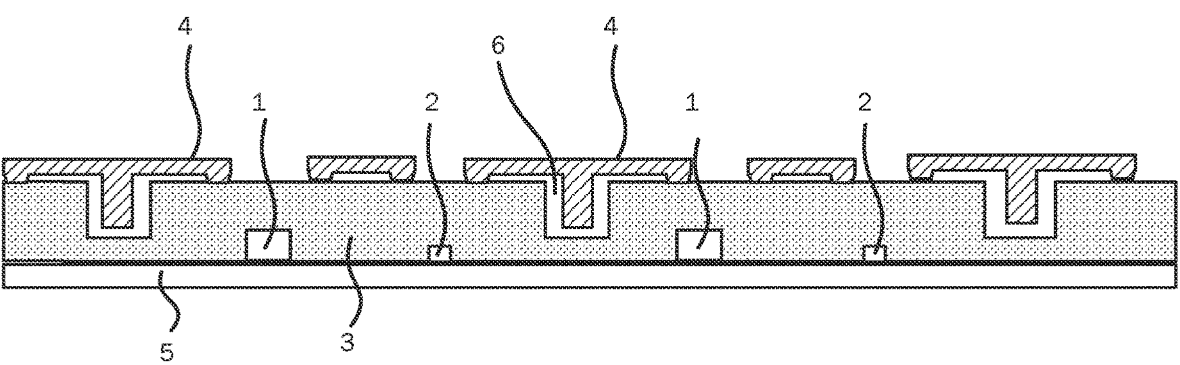
Figure 3G:
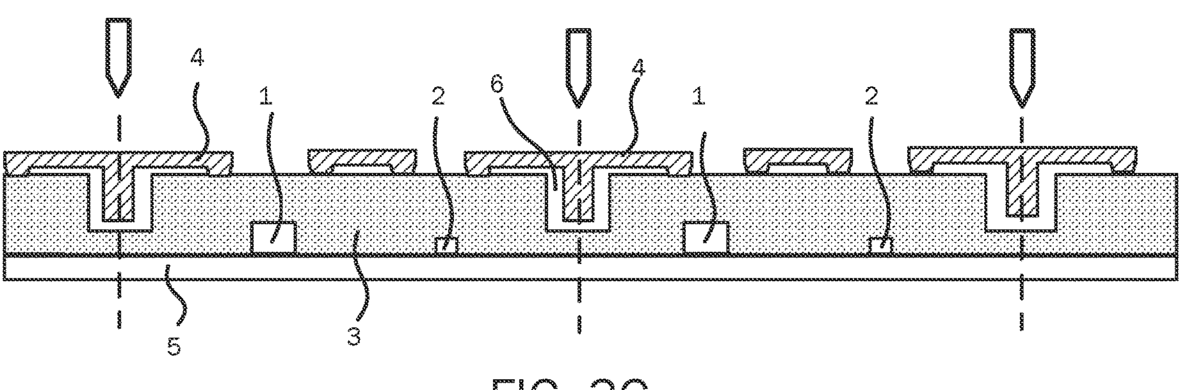

FIGS. 3A-3G show steps of manufacturing an optical sensing apparatus (e.g., the optical sensing apparatus 100, 200, 300, or 400) in accordance with one embodiment of the present disclosure. Referring to FIG. 3A, a covering cap 4 is formed by ablation, molding, injection molding, compression molding, transfer molding, machining, rapid prototyping, three-dimensional printing, or the like, and includes the first opening, the second opening, the top portion, the extending portion, and the protruding portion. Referring to FIG. 3B, the light-receiving device 1 and the light-emitting device 2 are bonded to the same side of the substrate 5. Then, referring to FIG. 3C, the encapsulating material 35 is formed to cover the light-receiving device 1 and the light-transmitting device 2 by printing, coating, spraying, dispensing, or molding. Optionally, a grinding process can be performed on the encapsulating material 35 for adjusting the thickness or planarization. Subsequently, referring to FIG. 3D, a portion of the encapsulating material 35 located in the recess 36 aligned to the extending portion of the covering cap 4 is removed by cutting to form the encapsulating structure 3 with the recess 36. Referring to FIG. 3E, a glue 7 is disposed on the top surface 31 and the recess 36 of the encapsulating structure 3. Then, referring to FIG. 3F, the covering cap 4 is moved to align with the encapsulating structure 3 and is adhered to the encapsulating structure 3 through the glue 7. After the adhering step, the glue 7 is cured and formed as the adhesive layer 6. Finally, referring to FIG. 3G, a dicing process is performed to form a plurality of optical sensing apparatuses.

Figure 4:
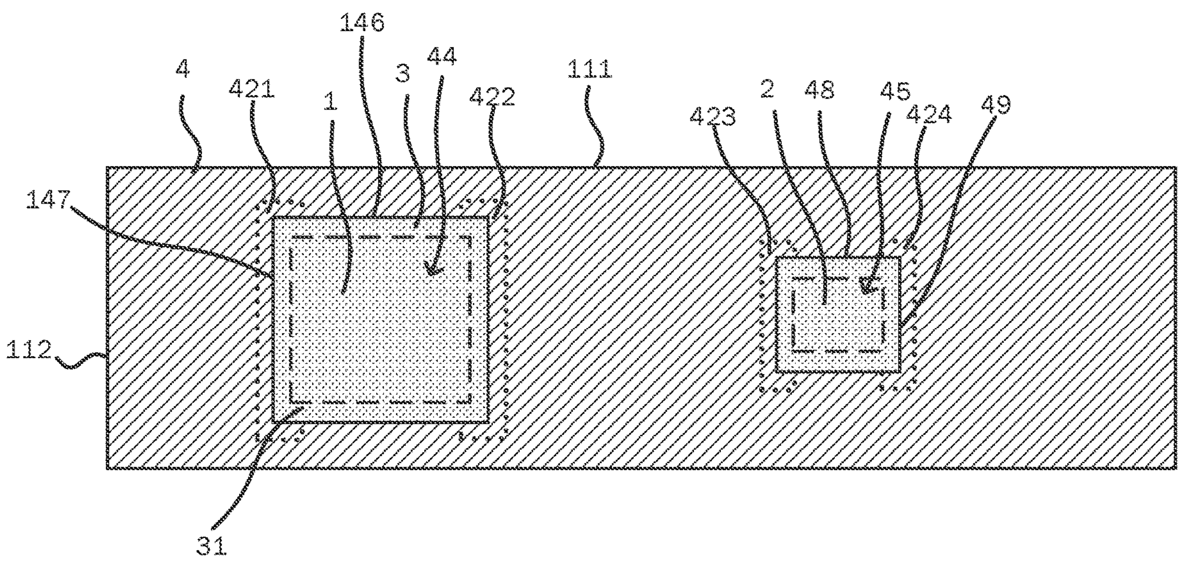
FIG. 4 shows a top view of an optical sensing apparatus in accordance with another embodiment of the present disclosure.

In another embodiment, the protruding portion of the covering cap 4 does not fully surround the openings of the covering cap 4. FIG. 4 shows a top view of an optical sensing apparatus 200 in accordance with another embodiment of the present disclosure. The optical sensing apparatus 200 has a longer side 111 and the shorter side 112. In an embodiment, the longer side 111 has a length in the range of 2~7 mm. The shorter side 112 has a length in the range of 0.5~5 mm. The distance between the longer side 111 to openings 44, 45 corresponding to the light-receiving device 1 or the light-transmitting device 2 is small, so that the glue is not easy to apply on this area of the top surface 31 of the encapsulating structure 3. That is to say, the adhesive layer 6 does not fully surround the first opening 44 and/or the second opening 45. The first opening 44 has a first side 146 parallel to the longer side 111 of the optical sensing apparatus 200, and a second side 147 parallel to the shorter side 112 of the optical sensing apparatus 200. The adhesive layer 6 fully surrounds the second side 147 or is fully filled in an area between the second side 147 and the shorter side 112 of the top surface 31 of the encapsulating structure 3. The adhesive layer 6 partially surrounds the first side 146 or is partially filled in an area between the first side 146 and the longer side 111 of the top surface 31 of the encapsulating structure 3. The protruding portion of the covering cap 4 has a first part 421 and the second part 422 which are separated from each other and surround the two opposite sides parallel to the shorter side 112 of the first opening 44. The first part 421 and the second part 422 of the protruding portion do not fully surround another opposite sides parallel to the longer side 111 of the first opening 44.

The second opening 45 has a first side 48 parallel to the longer side 111 of the optical sensing apparatus 200, and a second side 49 parallel to the shorter side 112 of the optical sensing apparatus 200. The adhesive layer 6 fully surrounds the second side 49 or is fully filled in an area between the second side 49 and the shorter side 112 of the top surface 31 of the encapsulating structure 3. The adhesive layer 6 partially surrounds the first side 48 or is partially filled in an area between the first side 146 and the longer side 111 of the top surface 31 of the encapsulating structure 3. The protruding portion of the covering cap 4 has a third part 423 and the fourth part 424 which are separated from each other and surround the two opposite sides parallel to the shorter side 112 of the second opening 45. The third part 423 and the fourth part 424 of the protruding portion do not fully surround another opposite sides parallel to the longer side 111 of the second opening 45.

Figure 5:
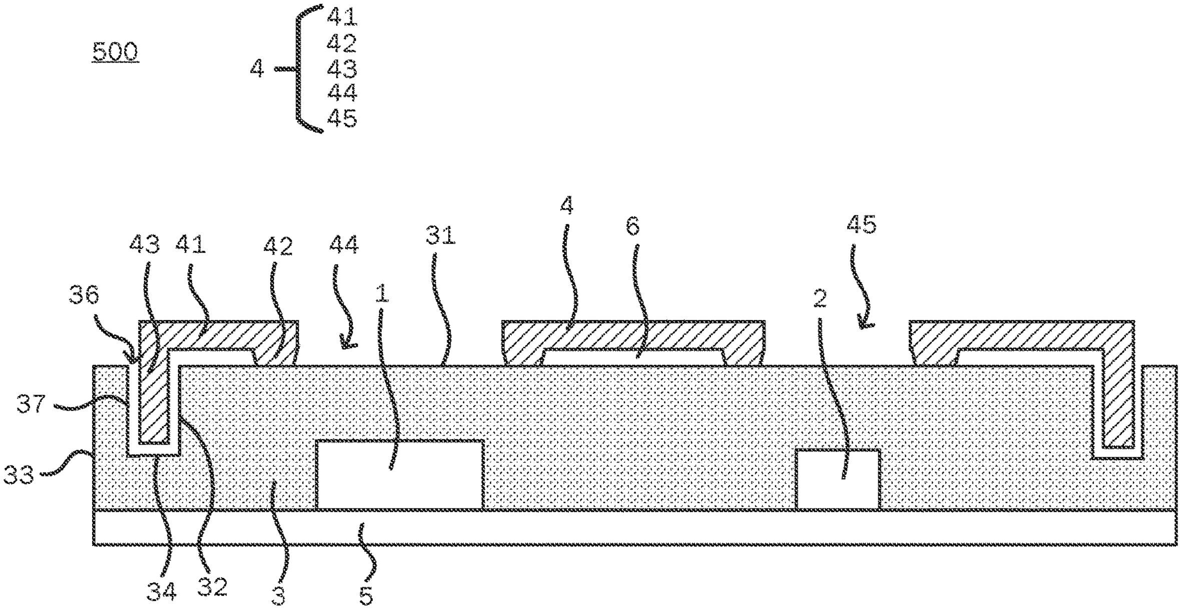
FIG. 5 shows a cross-sectional view of an optical sensing apparatus in accordance with another embodiment of the present disclosure.

In another embodiment, the outer side surface of the covering cap 4 is not coplanar to the encapsulating structure 3. FIG. 5 shows a cross-sectional view of an optical sensing apparatus 300 in accordance with another embodiment of the present disclosure. The encapsulating structure 3 has at least one recess 36 close to the periphery of the optical sensing apparatus 300. The encapsulating structure 3 has a first side surface 32, a second side surface 37 facing to the first side surface 32, and a lower surface 34 connected to the first side surface 32 and the second side surface 37. The first side surface 32, the second side surface 37, and the lower surface 34 are collectively formed the recess 36. The covering cap 4 has an extending portion 43 embedded in the recess 36 and adhered to the encapsulating structure 3 through the adhesive layer 6.

Figure 6:
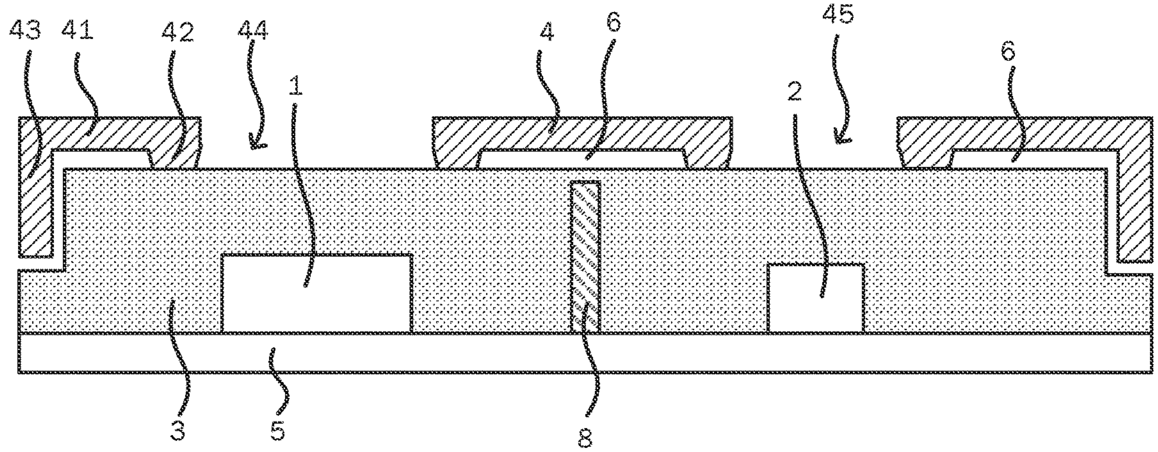
FIG. 6 shows a cross-sectional view of an optical sensing apparatus in accordance with another embodiment of the present disclosure.

In another embodiment, the optical sensing apparatus can have a blocking structure disposed between the light-receiving device 1 and the light-transmitting device 2 to reduce the interfering light from the light-transmitting device 2. FIG. 6 shows a cross-sectional view of an optical sensing apparatus 400 in accordance with another embodiment of the present disclosure. A blocking structure 8 is located between the light-receiving device 1 and the light-transmitting device 2 and covered by the encapsulating structure 3. The blocking structure 8 can be a silicone-based resin, epoxy-based resin and contain a light-absorbing substance to reducing the light emitted from the light-transmitting device 2 and radiating to the light-receiving device 1. Therefore, the sensitivity of the optical sensing apparatus can be further improved. In another embodiment, the blocking structure 8 contacts a portion of the covering cap 4 which is located above the blocking structure 8. In other words, the blocking structure 8 and the covering cap 4 can be integrated in one-piece structure.

Figure 7A:
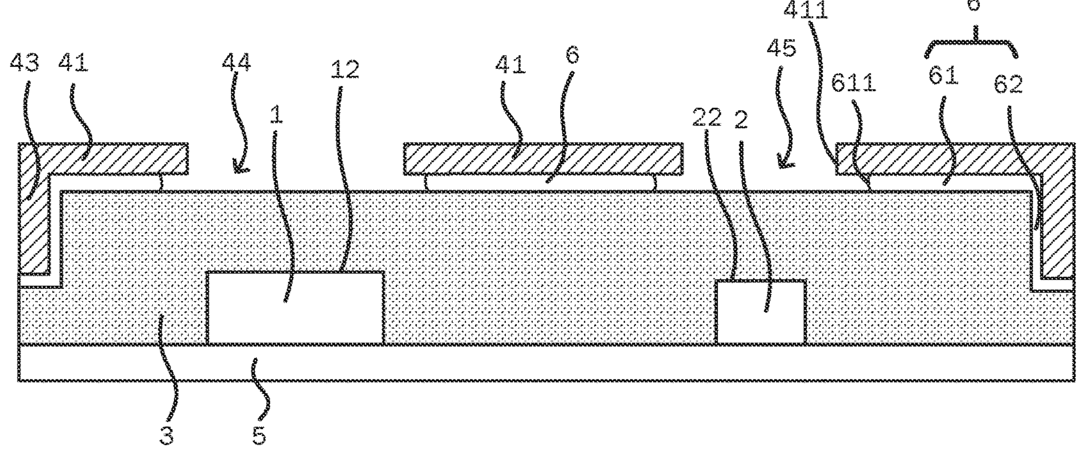
FIG. 7A shows a cross-sectional view of an optical sensing apparatus in accordance with another embodiment of the present disclosure.

In another embodiment, the covering cap 4 does not have the protruding portion. FIG. 7A shows a cross-sectional view of an optical sensing apparatus 700 in accordance with another embodiment of the present disclosure. The covering cap 4 is disposed on the encapsulating structure 3 to shield or absorb the interfering light. The covering cap 4 is adhered to the encapsulating structure 3 through the adhesive layer 6. Although the covering cap 4 does not have the protruding portion to prevent the adhesive layer 6 from overflowing into the first opening 44 and the second opening 45. However, the amount of the adhesive layer 6 can be adjusted so that the adhesive layer 6 does not exceed the outermost side of the covering cap 4 and overflow to the opening. As shown in FIG. 7A, the covering cap 4 includes a top portion 41, an extending portion 43 extending from the top portion 41 towards the substrate 5, a first opening 44, and a second opening 45. The adhesive layer 6 has a first portion 61 and a second portion 62. The first portion 61 is disposed on the top surface 31 of the encapsulating structure 3 for bonding the top portion 41 of the covering cap 4 to the encapsulating structure 3. The second portion 62 is disposed in the recess of the encapsulating structure 3, between the first side surface 32 and the extending portion 43, and between the lower surface 34 and the extending portion 43 for bonding the extending portion 43 to the encapsulating structure 3. The first portion 61 has an outmost side 611 close to the opening 45 or 44, and the outmost side 611 is shrunk from the outermost side 411 of the top portion 41 of the covering cap 4. The outmost side 611 of the first portion 61 of the adhesive layer 6 has a curved shape.

Figure 7B:
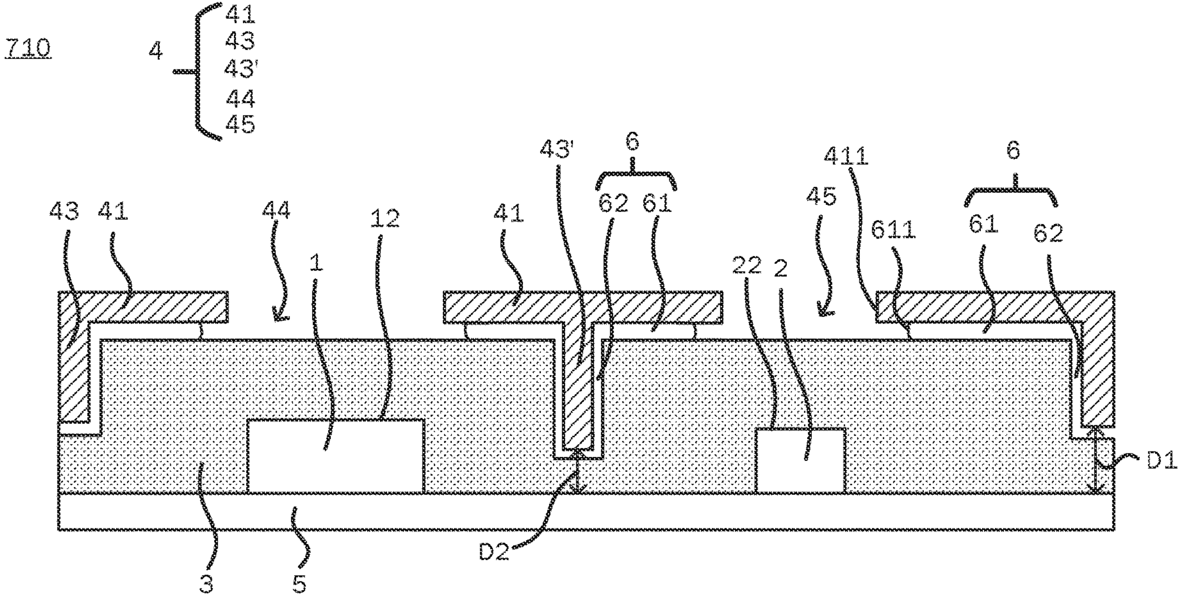
FIG. 7B shows a cross-sectional view of an optical sensing apparatus in accordance with another embodiment of the present disclosure.

In another embodiment, the extending portion of the covering cap 4 can be located between the light-receiving device 1 and the light-transmitting device 2 to reduce the interfering light from the light-transmitting device 2. FIG. 7B shows a cross-sectional view of an optical sensing apparatus 710 in accordance with another embodiment of the present disclosure. The covering cap 4 includes a top portion 41, a first extending portion 43, a second extending portion 43', a first opening 44, and a second opening 45. The first extending portion 43 and the second extending portion 43' extend from the top portion 41 towards the substrate 5. The first extending portion 43 is located at the periphery of the encapsulating structure 3 for enhancing the mechanical reliability of the optical sensing apparatus 710. The second extending portion 43' is located between the light-receiving device 1 and the light-transmitting device 2 to reduce the interfering light from the light-transmitting device 2. The covering cap 4 is adhered to the encapsulating structure 3 through the adhesive layer 6. The first extending portion 43 and the second extending portion 43' of the covering cap 4 are distant from the substrate 5 by a distance greater than zero. The distance D1 between the first extending portion 43 and the substrate 5 can be different from and less than the distance D2 between the second extending portion 43' and the substrate 5. In another embodiment, the distance D1 can be equal to or larger than the distance D2.

Figure 8A:
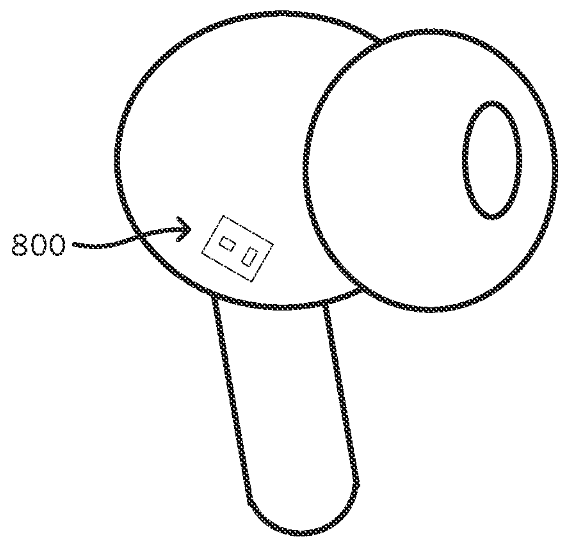
FIG. 8A shows an earbud including an optical sensor device in accordance with one embodiments of the present disclosure.
Figure 8B:
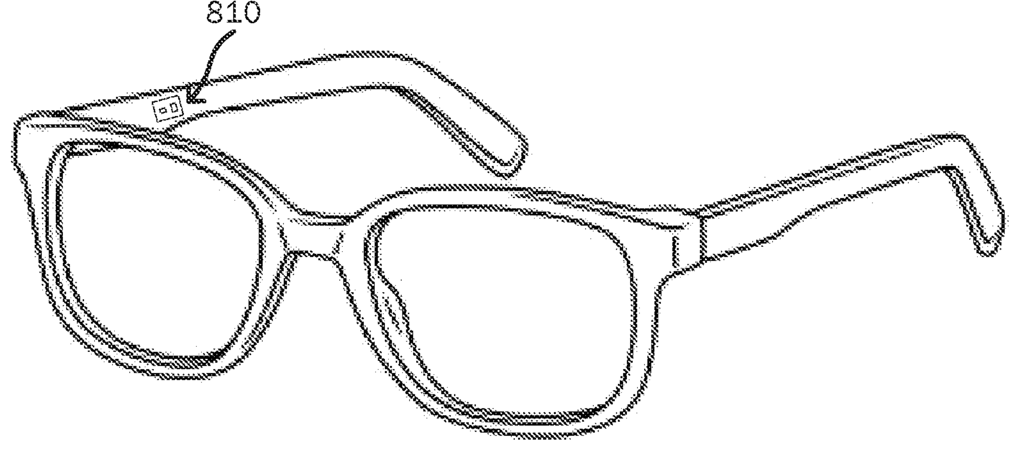
FIG. 8B shows a pair of glasses including an optical sensor device in accordance with one embodiments of the present disclosure.

FIGS. 8A-8B show different wearable devices including the optical sensor device in accordance with different embodiments of the present disclosure. FIG. 8A shows an earbud including an optical sensor device 800. When the user wears the earbud to listen to music or communicate, the optical sensor device 800 contacts the skin of the user and can be configured to measure various bioinformation at the same time. FIG. 8B shows a pair of glasses including an optical sensor device 810. When the user wears a pair of glasses, the optical sensor device 810 contacts the skin of the user and can be configured to measure various bioinformation at the same time. The optical sensor devices 800, 810 can be one of the aforementioned optical sensor devices. FIGS. 8A-8B show two examples of wearable devices, however suitable wearable devices such as helmet, wristband, watch, can be installed the optical sensor device to measure various bioinformation.

Figure 9:
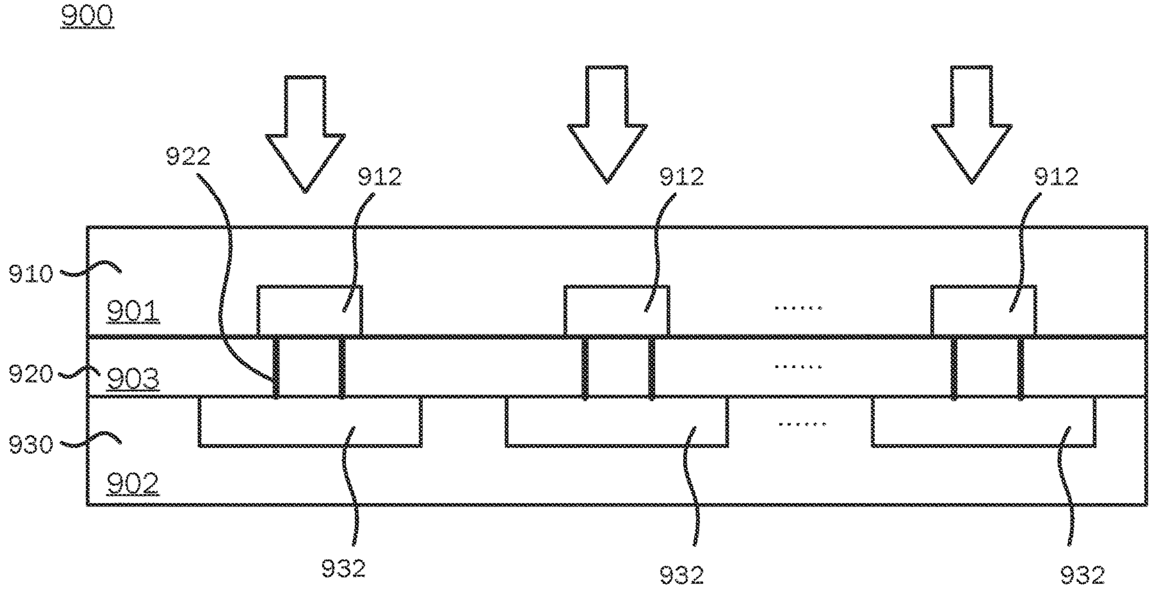
FIG. 9 shows a light-receiving element in accordance with one embodiments of the present disclosure.

FIG. 9 shows a light-receiving device in accordance with one embodiment of the present disclosure. The light-receiving device 900 includes a photoelectronic devices 901, a control device 902, and a bonding interface 903. The photoelectronic devices 901 and the control device 902 are wafer-bonded via a bonding interface 903 (e.g., oxide or any other suitable materials). The photoelectronic devices 901 includes a first substrate 910 and a plurality of detecting regions 912 deposited on the first substrate 910. The control device 902 includes a second substrate 930 and a plurality of corresponding circuitry areas 932 carried by the second substrate 930. Each circuitry area 932 is electrically coupled to the corresponding detecting region 912 through the conductive route 922 of the bonding interface 903. The first substrate 910 and the second substrate 930 can both be a silicon substrate. The detecting region 912 includes a material can be different from (e.g., fabricated from a heterogeneous material) or the same as (e.g., fabricated from a homogeneous material) the first substrate 910. In one embodiment, the material of the detecting region 912 that can include III-V material, such as P, N, Ga, In, Al. In another embodiment, the material of the detecting region 912 can include IV material such as germanium(Ge), Si.

Figure 10:
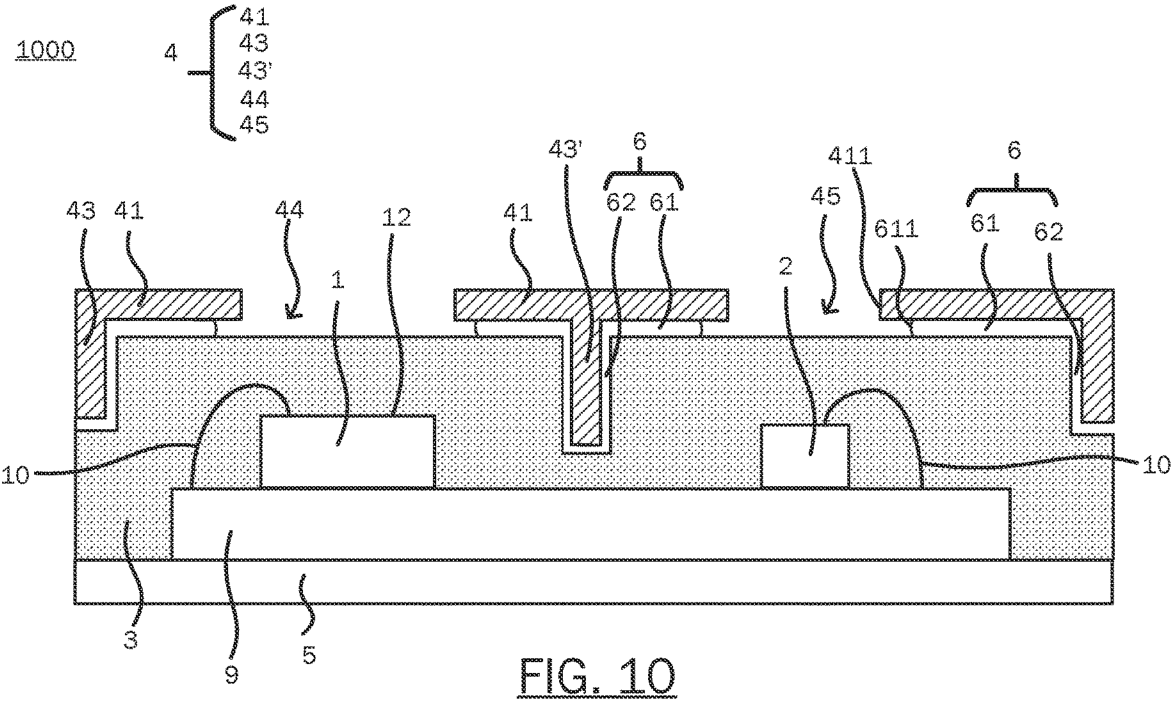
FIG. 10 shows a cross-sectional view of an optical sensing apparatus in accordance with another embodiment of the present disclosure.

FIG. 10 shows a cross-sectional view of an optical sensing apparatus 1000 in accordance with another embodiment of the present disclosure. The optical sensing apparatus 1000 is similar to the optical sensing apparatus 710 shown in FIG. 7B. The difference is the optical sensing apparatus 1000 includes a control element 9 configured to control the light-receiving device 1 and the light-transmitting device 2. The light-receiving device 1 and the light-transmitting device 2 are located on the control element 9 and electrically connected to the control element 9 through wire 10. The light-receiving device 1, the light-transmitting device 2, and the control element 9 are disposed over the substrate 5 and encapsulated by the encapsulating structure 3.

While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An optical sensing apparatus, comprising:

a substrate;

a light-receiving device disposed on and electrically connected to the substrate;

a light-emitting device disposed on and electrically connected to the substrate;

an encapsulating structure disposed on the substrate, covering the light-emitting device and the light-receiving device, the encapsulating structure comprising a top surface, a first side surface, a lower surface, wherein the first side surface and the lower surface are collectively formed a recess;

a covering cap composed of resin and disposed on the encapsulating structure, comprising a first opening, a top portion, a protruding portion, and an extending portion; and an adhesive layer arranged between the encapsulating structure and the covering cap to adhere the encapsulating structure and the covering cap, wherein the protruding portion extends from the top portion towards the substrate, and contacts to the top surface of the encapsulating structure, such that the protruding portion physically separates the first opening from the adhesive layer, wherein the extending portion extends from the top portion towards the substrate, and is arranged in the recess, and wherein the covering cap does not extend beyond the encapsulating structure in a top view.

2. The optical sensing apparatus of claim 1, wherein the covering cap comprises a material configured to shield or absorb a NIR light or a SWIR light.

3. The optical sensing apparatus of claim 1, wherein the encapsulating structure comprises a material transparent to a NIR light or a SWIR light.

4. The optical sensing apparatus of claim 1, wherein the light-receiving device comprises a photoelectronic device having a detecting region comprising germanium.

5. The optical sensing apparatus of claim 1, wherein the first opening has a first position corresponding to the light-receiving device in a cross-sectional view.

6. The optical sensing apparatus of claim 1, wherein the extending portion is located at a periphery of the encapsulating structure.

7. The optical sensing apparatus of claim 1, wherein the extending portion has an outer side surface coplanar to that of the encapsulating structure.

8. The optical sensing apparatus of claim 1, wherein the protruding portion surrounds the first opening.

9. The optical sensing apparatus of claim 1, wherein the protruding portion surrounds at least a portion of the first opening.

10. The optical sensing apparatus of claim 1, wherein the covering cap comprises a second opening having a second position corresponding to the light-emitting device.

11. The optical sensing apparatus of claim 10, wherein the protruding portion surrounds at least a portion of the second opening.

12. The optical sensing apparatus of claim 10, wherein the second opening has an area smaller than that of the first opening.

13. The optical sensing apparatus of claim 1, wherein the adhesive layer has a first portion located between the top portion and the top surface, and a second portion located in the recess, the first portion has a thickness thicker than that of the second portion.

14. The optical sensing apparatus of claim 1, wherein the light-receiving device has an area larger than the light-emitting device.

15. The optical sensing apparatus of claim 1, wherein the extending portion of the covering cap has a lower end distant from the substrate by a distance in a range of 50 μm to 200 μm.

16. A method for manufacturing an optical sensing apparatus, comprising:

forming a covering cap composed of resin and comprising a first opening, a top portion, a protruding portion, and an extending portion;

providing a substrate;

disposing a light-receiving device and a light-emitting device on the substrate;

forming an encapsulating structure on the substrate to cover the light-emitting device and the light-receiving device;

forming a recess on the encapsulating structure for accommodating the extending portion;

forming a glue on the encapsulating structure;

aligning the covering cap to the light-receiving device and the light-emitting device, so that the first opening is located above the light-receiving device;

adhering the covering cap on the encapsulating structure through the glue such that the protruding portion physically separates the first opening from the glue; and dicing to form the optical sensing apparatus.

* * * * *